United States Patent
Munnig Schmidt (10) Patent No.: US 7,242,458 B2
(45) Date of Patent: Jul. 10, 2007

(54) LITHOGRAPHIC APPARATUS AND DEVICE MANUFACTURING METHOD UTILIZING A MULTIPLE SUBSTRATE CARRIER FOR FLAT PANEL DISPLAY SUBSTRATES

(75) Inventor: Robert-Han Munnig Schmidt, Hapert (NL)

(73) Assignee: ASML Netherlands B.V. (NL)

( * ) Notice: Subject to any disclaimer, the term of this patent is extended or adjusted under 35 U.S.C. 154(b) by 149 days.

(21) Appl. No.: 11/067,671

(22) Filed: Mar. 1, 2005

(65) Prior Publication Data

US 2006/0139602 A1 Jun. 29, 2006

Related U.S. Application Data

(60) Provisional application No. 60/638,171, filed on Dec. 23, 2004.

(51) Int. Cl.
*G03B 27/58* (2006.01)
*G03B 27/42* (2006.01)

(52) U.S. Cl. .......................................... 355/72; 355/53
(58) Field of Classification Search .................. 355/53, 355/72–76
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,698,944 B2 * | 3/2004 | Fujita | 396/611 |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,879,866 B2 * | 4/2005 | Tel et al. | 700/100 |
| 2004/0041104 A1 | 3/2004 | Liebregts et al. | |
| 2004/0130561 A1 | 7/2004 | Jain | |
| 2005/0007572 A1 | 1/2005 | George et al. | |
| 2006/0092399 A1 * | 5/2006 | Ockwell | 355/72 |

FOREIGN PATENT DOCUMENTS

| | | |
|---|---|---|
| WO | WO 98/33096 | 7/1998 |
| WO | WO 98/38597 | 9/1998 |

\* cited by examiner

*Primary Examiner*—Henry Hung Nguyen
(74) *Attorney, Agent, or Firm*—Sterne, Kessler, Goldstein & Fox, PLLC (57) ABSTRACT

A system and method allow for more than one substrate to be simultaneously moved and/or positioned on a support table. In one example, this is accomplished through use of a frame that either supports or separates one or more substrates for either transport or positioning on a support table. In another example, this is accomplished through use of spacers on a support table, which are used to properly position one or more substrates. In yet another example, this is accomplished through use of a robot placing one or more substrates on the support table.

20 Claims, 9 Drawing Sheets

LITHOGRAPHIC APPARATUS AND DEVICE MANUFACTURING METHOD UTILIZING A MULTIPLE SUBSTRATE CARRIER FOR FLAT PANEL DISPLAY SUBSTRATES

CROSS REFERENCE TO RELATED APPLICATIONS

This application claims priority under 35 U.S.C. §119(e) to U.S. Provisional Patent Application No. 60/638,171, filed Dec. 23, 2004, which is incorporated by reference herein in its entirety.

BACKGROUND

1. Field

The present invention relates to a lithographic apparatus and a method for manufacturing a device.

2. Related Art

A lithographic apparatus is a machine that applies a desired pattern onto a substrate, usually onto a target portion of the substrate. A lithographic apparatus can be used, for example, in the manufacture of flat panel displays, integrated circuits (ICs) and other devices involving fine structures. In a conventional apparatus, a patterning device, which may be referred to as a mask or a reticle, may be used to generate a circuit pattern corresponding to an individual layer of a flat panel display (or device). This pattern can be transferred onto a target portion (e.g. comprising part of, one, or several dies) on a substrate (e.g. a glass plate). Transfer of the pattern is typically via imaging onto a layer of radiation-sensitive material (resist) provided on the substrate.

Instead of a circuit pattern, the patterning means may be used to generate other patterns, for example a color filter pattern, or a matrix of dots. Instead of a mask, the patterning device may comprise a patterning array that comprises an array of individually controllable elements. An advantage of such a system compared to a mask-based system is that the pattern can be changed more quickly and for less cost.

In general, a flat panel display substrate is rectangular in shape. Known lithographic apparatus designed to expose a substrate of this type typically provide an exposure region which covers a full width of the rectangular substrate, or which covers a portion of the width (for example half of the width). The substrate is scanned underneath the exposure region, whilst the mask or reticle is synchronously scanned through the projection beam. In this way, the pattern is transferred to the substrate. If the exposure region covers the full width of the substrate then exposure is completed with a single scan. If the exposure region covers, for example, half of the width of the substrate, then the substrate is moved transversely after the first scan, and a second scan is performed to expose the remainder of the substrate.

Another way of imaging includes pixel grid imaging, in which a pattern is realized by successive exposure of spots.

Typically, substrate support devices that support a substrate during patterning are sized to hold one substrate. This is true as substrates have become larger and larger, for example, in the formation of flat panel displays. However, when smaller substrates are sometimes used on these large support devices, only one is exposed at a time even. This reduces throughput and makes the systems inefficient.

Therefore, what is needed is a system and method that allow for increased throughput in a lithography system.

SUMMARY

According to one example of the present invention, there is provided a lithographic apparatus comprising an illumination system, a patterning system, a substrate table, a projection system, and a substrate handler. The illumination system supplies a projection beam of radiation. The patterning system patterns the beam. The substrate table simultaneously supports one or more substrates. The projection system projects the patterned beam onto a target portion of the one or more substrates. The substrate handler moves each of the one or more substrates relative to the substrate table. The substrate handler carries one or more of the one or more substrates simultaneously.

According to one embodiment of the present invention, there is provided a method comprising the following steps. Patterning a beam of radiation. Projecting the patterned beam onto a target portion of each of one or more substrates simultaneously supported on a same support table. Singly or simultaneously moving each of the one or more substrates between a handling device and the support table.

Further embodiments, features, and advantages of the present inventions, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements.

DETAILED DESCRIPTION

In one embodiment of the present invention, a scheme is used to allow for more than one substrate to be simultaneously moved and/or positioned on a support table. In one example, this is accomplished through use of a frame that either supports or separates one or more substrates for either transport or positioning on a support table. In another example, this is accomplished through use of spacers on a support table, which are used to properly position one or more substrates. In yet another example, this is accomplished through use of a robot placing one or more substrates on the support table.

Overview and Terminology

The terms "contrast device," "patterning device," "patterning array," or "array of individually controllable elements" used herein should be broadly interpreted as referring to any device that can be used to modulate the cross-section of a radiation beam such as to create a pattern in a target portion of the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit. The terms "light valve" and "Spatial Light Modulator" (SLM) can also be used in this context. Examples of such patterning devices include:

A programmable mirror array. This can comprise a matrix-addressable surface having a viscoelastic (e.g., having viscous as well as elastic properties) control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (Micro Electro-Mechanical Systems) can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. Mirror arrays are described in, for example, U.S. Pat. Nos. 5,296,891 and 5,523,193, and PCT patent applications WO 98/38597 and WO 98/33096, which are incorporated herein by reference in their entireties.

A programmable LCD array is another example. Programmable LCD arrays are described in, for example, U.S. Pat. No. 5,229,872, which is incorporated herein by reference in its entirety.

The lithographic apparatus can comprise one or more patterning arrays. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements and a common projection system (or part of the projection system).

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. Any use of the term "projection lens" herein can be considered as synonymous with the more general term "projection system".

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements, such as a micro lens array (known as an MLA) or a Fresnel lens array, e.g. to form the secondary sources and to image spots onto the substrate. In such an arrangement, each of the focusing elements in the array of focusing elements can be associated with one of the individually controllable elements in the array of individually controllable elements. Alternatively, the projection system can be configured such that radiation from a plurality of the individually controllable elements in the array of individually controllable elements is directed to one of the focusing elements in the array of focusing elements and from there onto the substrate.

As herein depicted in the figures below, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (e.g., dual stage) or more (e.g., multiple stage) substrate tables. In such "multiple stage" machines the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g. water, so as to fill a space between the projection system and the substrate. An immersion liquid can also be applied to other spaces in the lithographic apparatus, for example, between the contrast device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

In another example, the invention can take the form of a computer program containing one or more sequences of machine-readable instructions describing a method as disclosed above, or a data storage medium (e.g. semiconductor memory, magnetic or optical disk) having such a computer program stored therein.

Exemplary Environment

Figure 1:
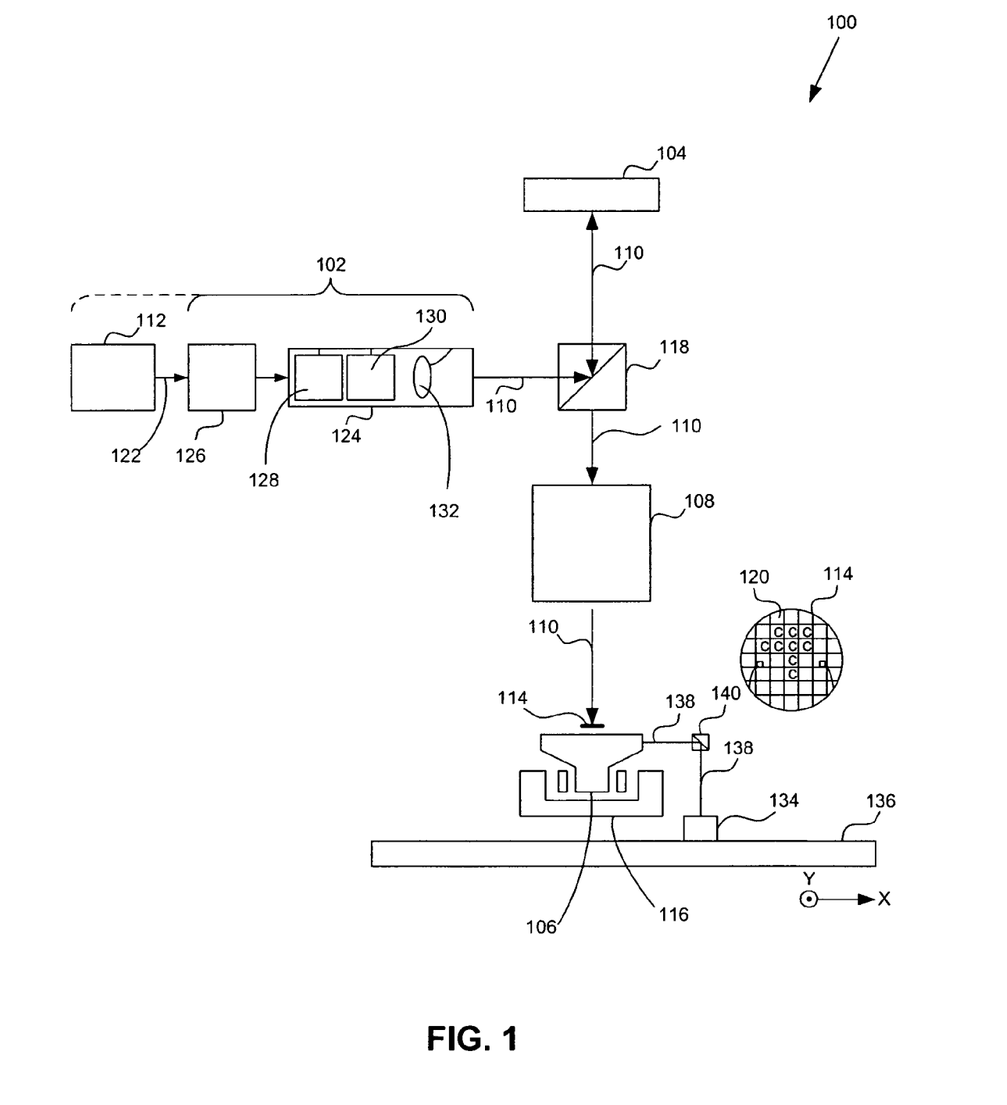
FIG. 1 depicts a lithographic apparatus, according to one embodiment of the invention.

FIG. 1 schematically depicts a lithographic projection apparatus 100 according to an embodiment of the invention. Apparatus 100 includes at least a radiation system 102, an array of individually controllable elements 104 (e.g., a contrast device or patterning device), an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., a frequency tripled Nd:YAG laser in pixel grid imaging mode or an excimer laser in other modes) can produce a beam of radiation 122. Beam 122 is fed into an illumination system (e.g., illuminator) 124, either directly or after having traversed conditioning device 126, such as a beam expander, for example.

In one example, when apparatus 100 is operating in a pixel grid imaging mode, illuminator 124 can comprise an adjusting device 128 for setting a zoom to adjust a spot size of beam 122. In addition, illuminator 124 will generally include various other components, such as spot generator 130 and a condenser 132. For example, spot generator 130 can be, but is not limited to, a refractive or diffractive grating, segmented mirrors arrays, waveguides, or the like. In this way, beam 110 impinging on the array of individually controllable elements 104 has a desired zoom, spot size, uniformity, and intensity distribution in its cross section.

In another example, when apparatus 100 is operating in other modes, illumination 124 can comprise an adjusting device 128 for setting the outer and/or inner radial extent (commonly referred to as (σ-outer and σ-inner, respectively) of the intensity distribution in beam 122. In addition, illuminator 124 will generally include various other components. In this example, element 130 could be an integrator 130 and element 132 could be a condenser 132, compared to the example discussed above. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100. In alternative embodiments, source 112 can be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved, so as to position different target portions 120 in the path of beam 110. Where used, the positioning device (not shown) for the array of individually controllable elements 104 can be used to correct the position of the array of individually controllable elements 104 with respect to the path of beam 110, e.g., during a scan. In general, movement of object table 106 is realized with the aid of a long-stroke module (coarse positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in a plurality of modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: similar to step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: similar to pulse mode except that a substantially constant radiation system 102 is used and the pattern on the array of individually controllable elements 104 is updated as patterned beam 110 scans across substrate 114 and exposes it.

5. Pixel Grid Imaging Mode: the pattern formed on substrate 114 is realized by subsequent exposure of spots formed by spot generator 130 that are directed onto array 104. The exposed spots have substantially the same shape. On substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

Figure 2:
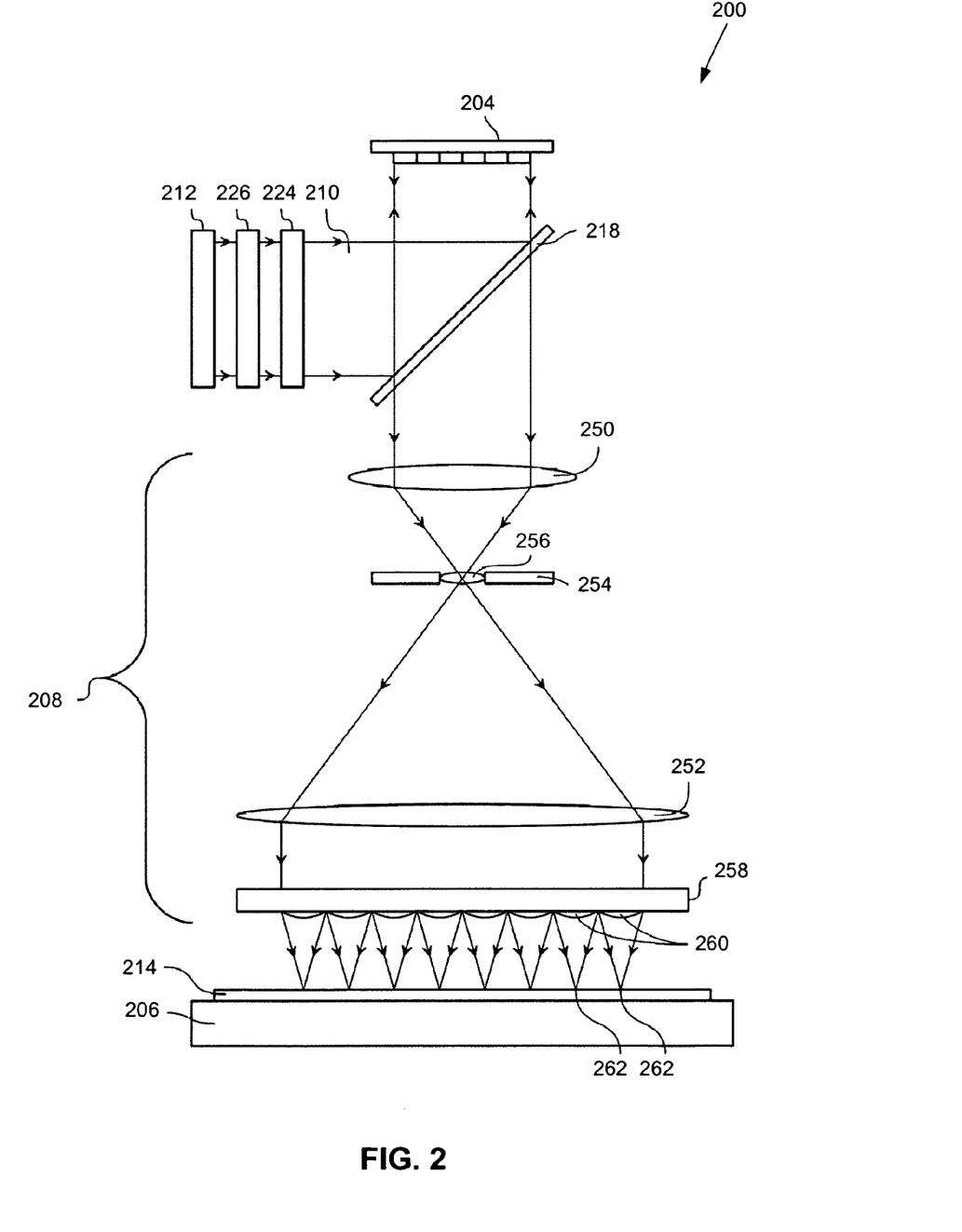
FIG. 2 depicts a lithographic apparatus that can be used in the manufacture of a flat panel display, according to one embodiment of the present invention.

FIG. 2 depicts an arrangement of an apparatus 200, according to one embodiment of the present invention. For example, apparatus 200 may be especially useful in the manufacture of flat panel displays. Components corresponding to those shown in FIG. 1 are depicted with similar reference numerals and their description is not repeated except where appropriate.

As shown in FIG. 2, projection system 208 includes a beam expander, which comprises two lenses 250 and 252. First lens 250 is arranged to receive a modulated radiation beam 210 and focus it through an aperture in an aperture stop 254. In one example, a lens 256 is located in the aperture. Radiation beam 110 then diverges and is focused by second lens 252 (e.g., a field lens).

Projection system 208 further comprises an array of lenses (MLA) 258 arranged to receive expanded modulated radiation 110. Different portions of the modulated radiation beam 110, corresponding to one or more of the individually controllable elements in a patterning device 204, pass through respective different lenses 260 in MLA 258. Each lens 260 focuses the respective portion of the modulated radiation beam 110 to a point which lies on a substrate 214. In this way, an array of radiation spots 262 are exposed onto substrate 214. It will be appreciated that although only eight lenses 260 are shown, MLA 258 can comprise many thousands of lenses, which is also true of the array of individually controllable elements used as patterning device 204.

Figure 3:
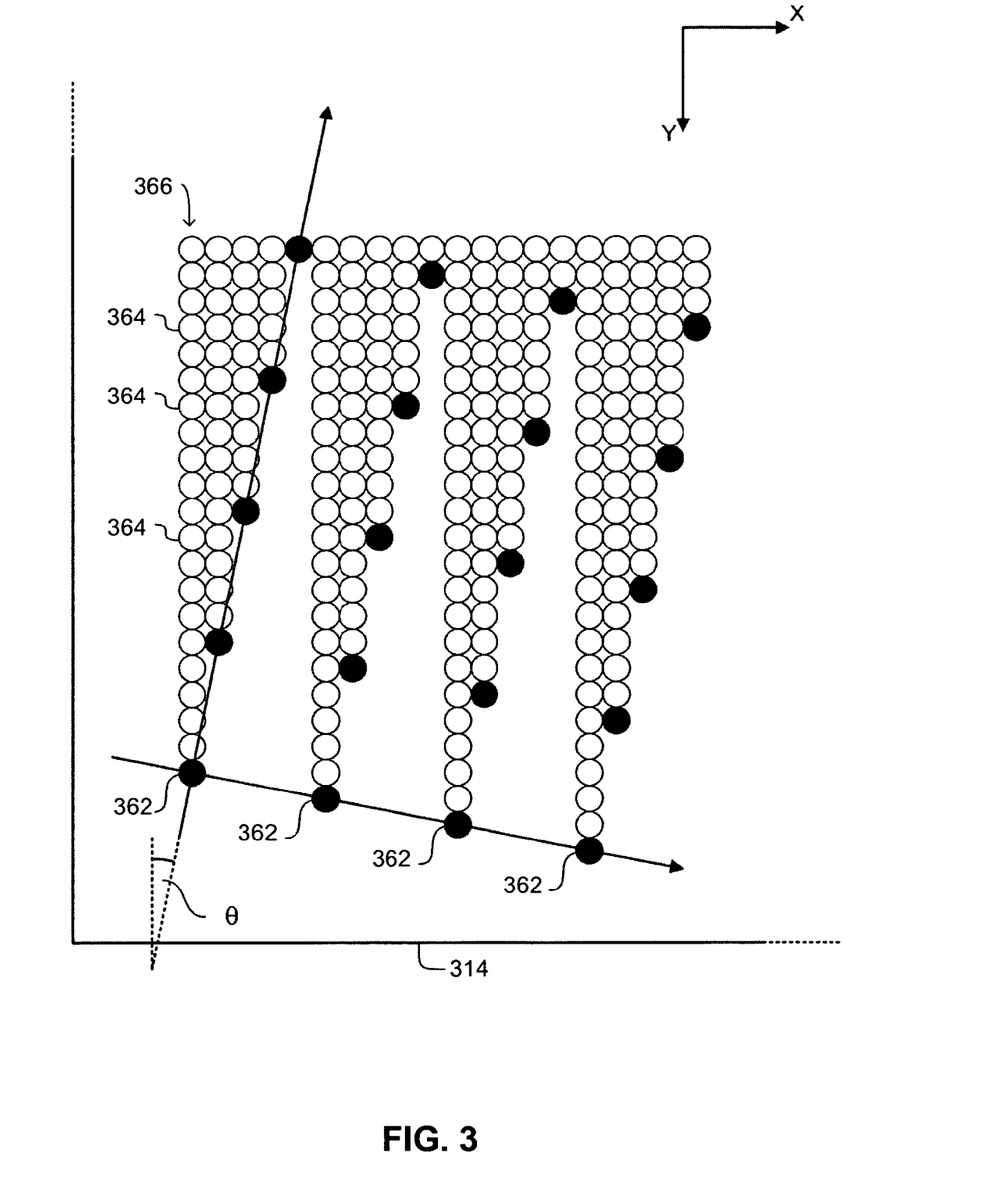
FIG. 3 depicts the mode of transferring a pattern to a substrate using a lithographic apparatus, according to one embodiment of the present invention.

FIG. 3 illustrates schematically how a pattern on a substrate 314 is generated, according to one embodiment of the present invention. The filled in circles represent a array of spots 362 projected onto substrate 314 by an MLA in a projection system, for example as shown in FIG. 2. Substrate 314 is moved relative to the projection system in a Y direction as a series of exposures are exposed on substrate 314.

The open circles represent spot exposures 364 that have previously been exposed on substrate 314. As shown, each spot 362 projected onto substrate 314 by the array of lenses within the projection system exposes a row 366 of spot exposures on substrate 314. The complete pattern for substrate 314 is generated by the sum of all the rows 366 of spot exposures 3664 exposed by each of the spots 362. Such an arrangement is commonly referred to as "pixel grid imaging," a was discussed above.

It can be seen that the array of radiation spots 362 is arranged at an angle θ relative to substrate 314 (the edges of the substrate 314 lie parallel to the X and Y directions). This is done so that when substrate 314 is moved in a scanning direction (e.g., the Y-direction), each radiation spot 362 will pass over a different area of substrate 314, thereby allowing the entire substrate to be covered by the array of radiation spots. It will be appreciated that for ease of illustration the angle θ is exaggerated in FIG. 3.

Figure 4:
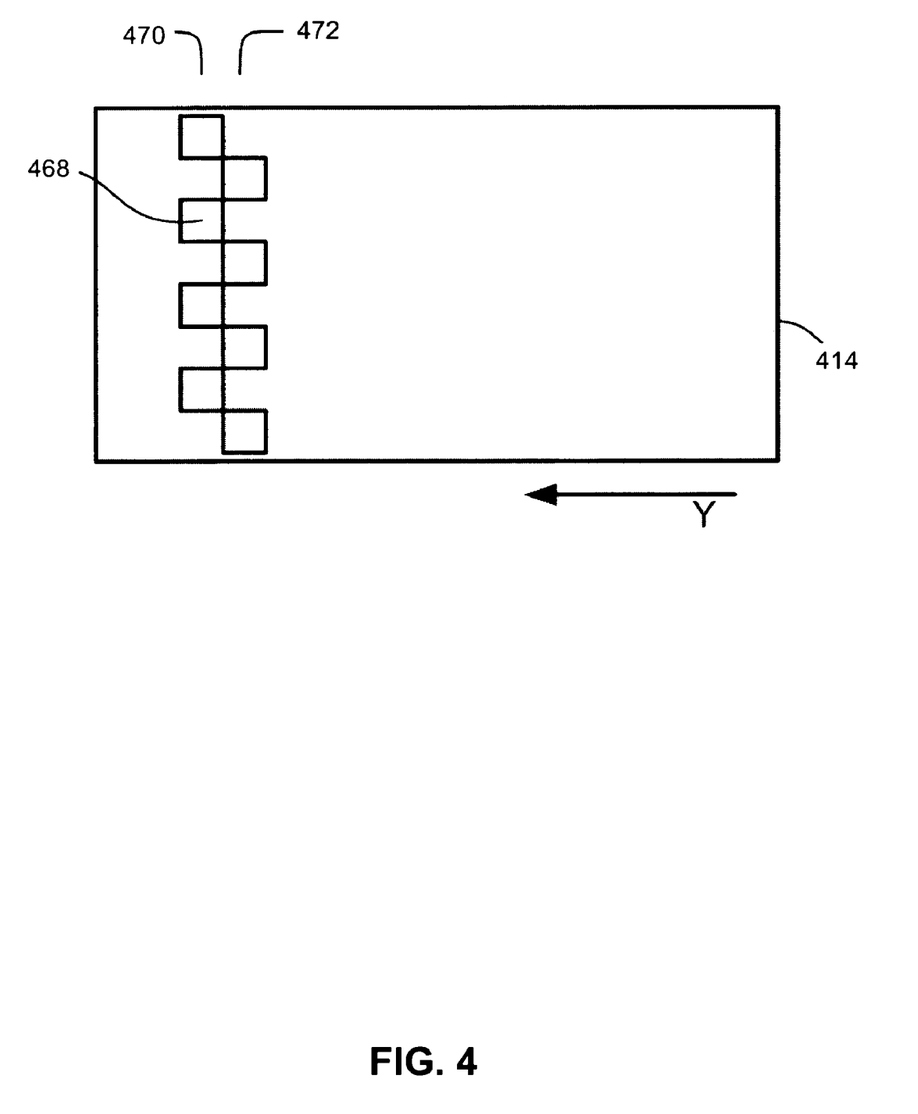
FIG. 4 depicts an arrangement of optical engines for exposing a pattern on a substrate used to manufacture a flat panel display, according to one embodiment of the present invention.

FIG. 4 shows schematically how an entire flat panel display substrate 414 is exposed in a single scan through use of a plurality of optical engines, according to one embodiment of the present invention. Eight arrays 468 of radiation spots are produced by eight optical engines (not shown), arranged in two rows 470,472 in a 'chess board' configuration, such that the edge of one array of radiation spots slightly overlaps (e.g., in the scanning direction Y) with the edge of the adjacent array of radiation spots. In this example, a band of radiation extends across a width of substrate 414, allowing exposure of the entire substrate to be performed in a single scan. It will be appreciated that any suitable number of optical engines may be used.

In one example, each optical engine may comprise a separate illumination system, patterning device, and projection system, as described above. It is to be appreciated, however, that two or more optical engines may share at least a part of one or more of the illumination system, patterning device, and projection system.

Figure 5:
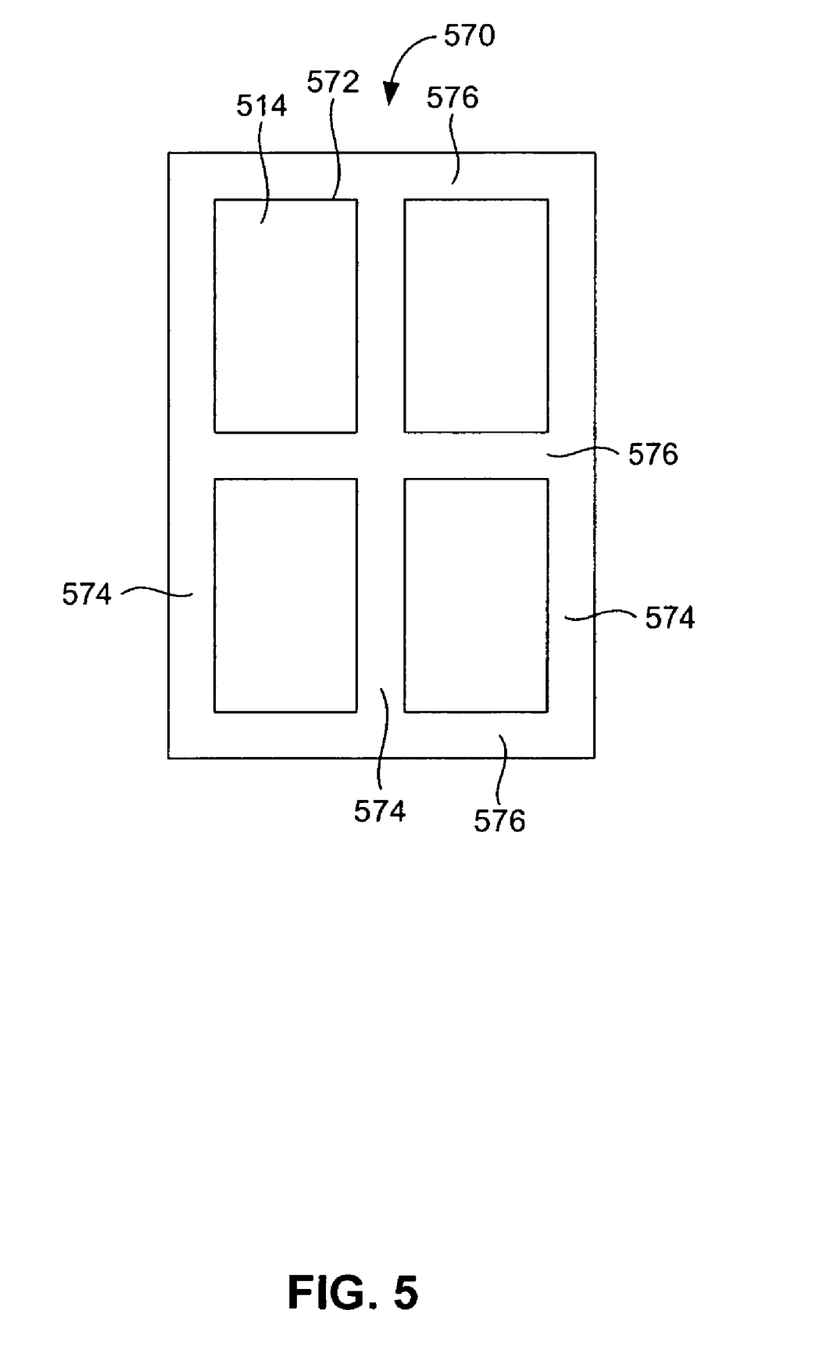
FIGS. 5, 6, and 7 show a top, perspective, and cross-sectional view (looking into line A—A in FIG. 6), respectively, of a multiple plate holding device, according to one embodiment of the present invention.
Figure 6:
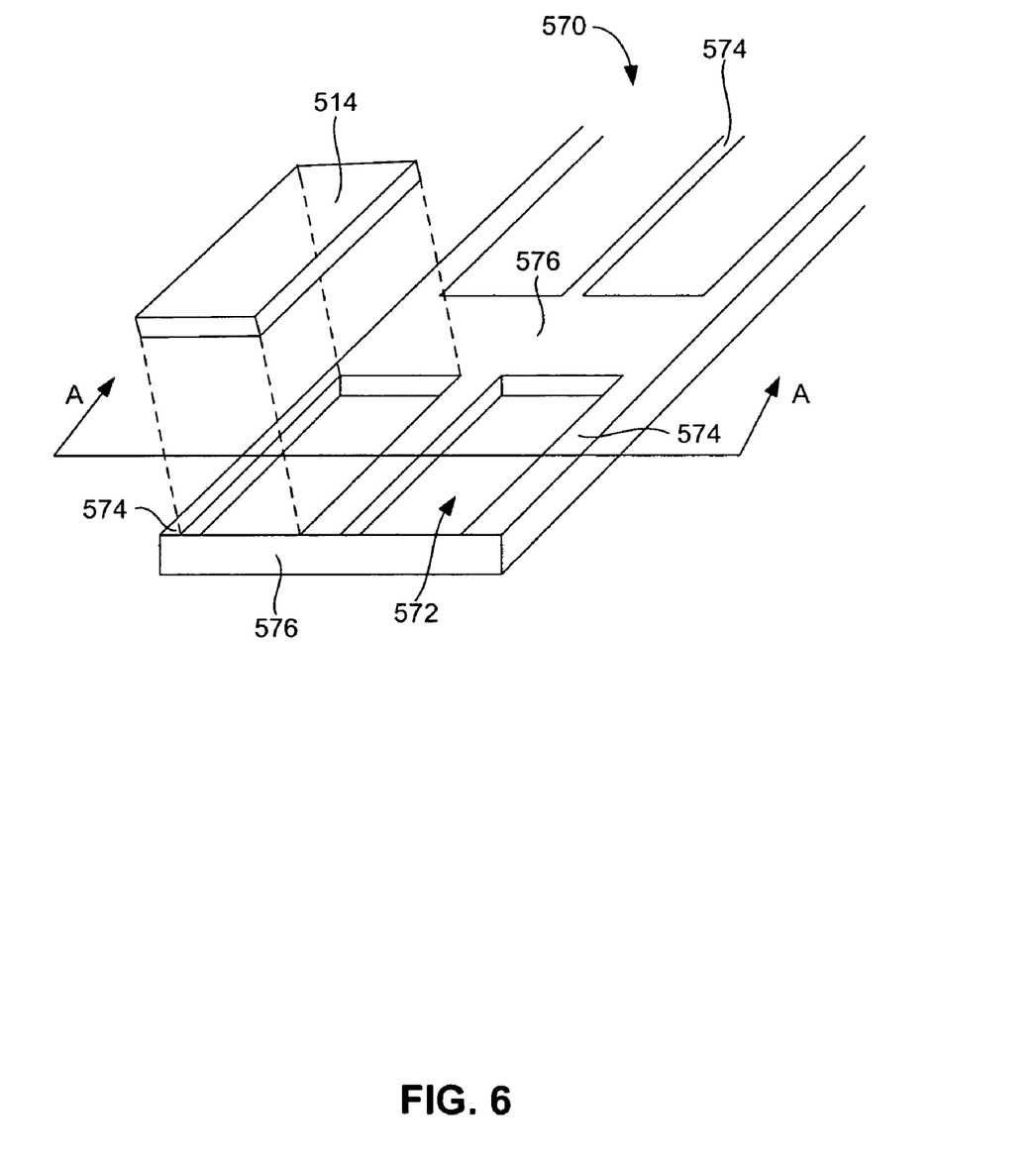
Figure 7:
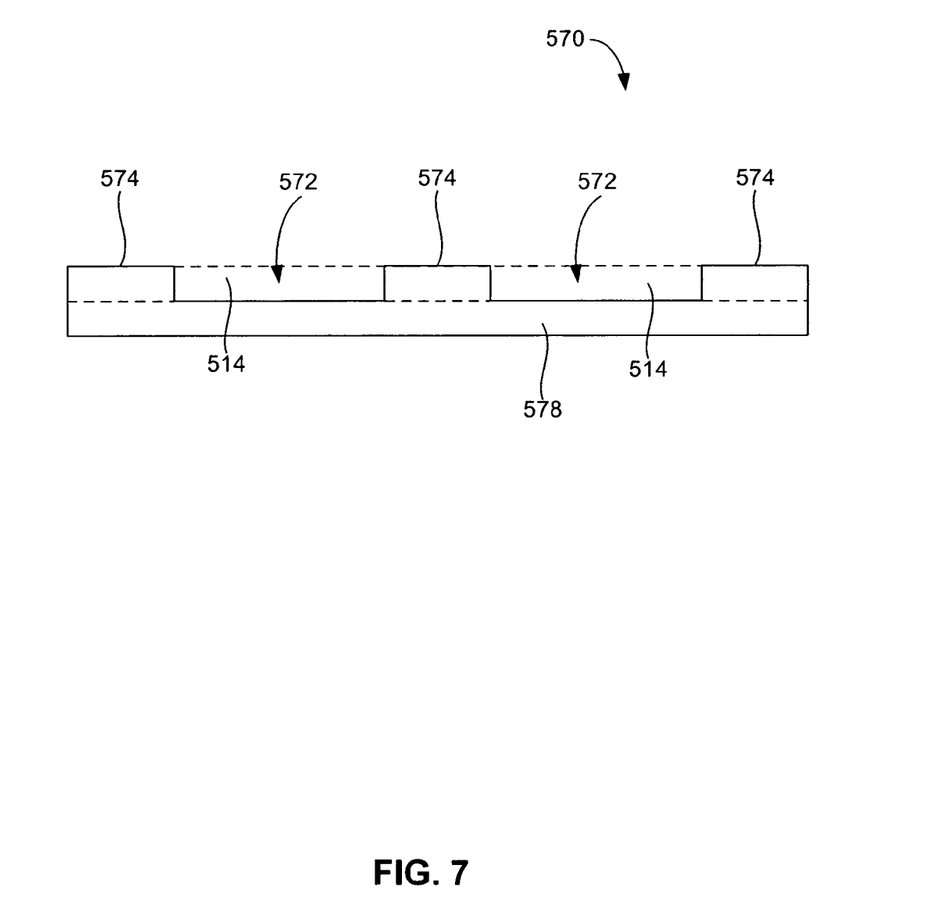

FIGS. 5, 6, and 7 show a top, perspective, and cross-sectional view (looking into line A—A in FIG. 6), respectively, of a multiple plate holding device 570, according to one embodiment of the present invention. Device 570 can be a frame that includes one or more sections 572, in this case four sections, which hold, position, and/or secure one substrate 514 each. It is to be appreciated that any number of substrates 514 can be positioned and securely held in device 570, including one or more plates. These sections 572 can be formed using various separation devices, such as horizontal portions 574 and vertical portions 576. For example, sections 572 can either be recesses (see FIG. 6) within device 570, spaces (see FIG. 7) between vertical and horizontal sections 574 and 576, formed through spacers between substrates 514, or the like. In the latter case, horizontal and vertical section 574 and 576 can be built up on a surface of a support 578 (see FIG. 7). Horizontal and vertical sections 574 and 576 are sized to ensure panels placed therebetween are not damaged and do not touch each other, but can be application specific.

In one example, a spacer or separating device between substrates 514 can be movable or retractable. This can allow for various sized substrates 514 to be positioned at a same time on a support table, handler, and/or robot.

Figure 8:
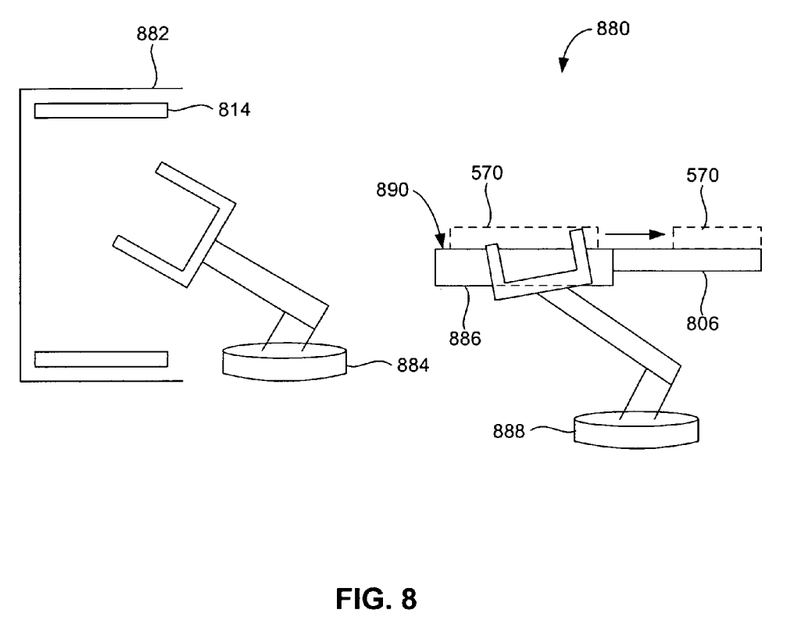
FIG. 8 shows a portion of a lithography apparatus, according to one embodiment of the present invention.

FIG. 8 shows a portion 880 of a lithography apparatus, according to one embodiment of the present invention. Portion 880 includes a substrate storage device 882 that stores substrates 814, a robot 884, a substrate handler 886, and an substrate table 806. In operation, a substrate 814 (or panel) is retrieved from substrate storage 882 using robot 884 and moved to handler 886. Handler 886 transports substrate 814 to and from table 806 before and after an exposure operation.

In one example, device 570 is positioned on handler 886, and robot 884 places one or more substrates 814 into or on device 570. For example, robot 884 can place each substrate 814 into each section 572 of device 570. Then, handler 886 moves device 570 and substrates 814 onto table 806 for exposure.

In another example, device 570 is located on table 806. In this example, robot 884 moves one or more substrates 814 onto handler 886, and an additional robot 888, if necessary, moves one or more substrates 814 from handler 886 into or onto device 570. In one example, robot 884 is large enough to move substrates 814 from storage 882 into or onto device 570 that is located on table 806.

In another example, no device 570 is necessary, and robot 884 places as many substrates 814 are desired onto handler 886, and then either robot 884 or robot 888 moves substrates 814 onto table 806.

Exemplary other handlers are taught in U.S. Provisional Patent Application 60/639,960, filed Dec. 30, 2004, which is incorporated by reference herein in its entirety.

Figure 9:
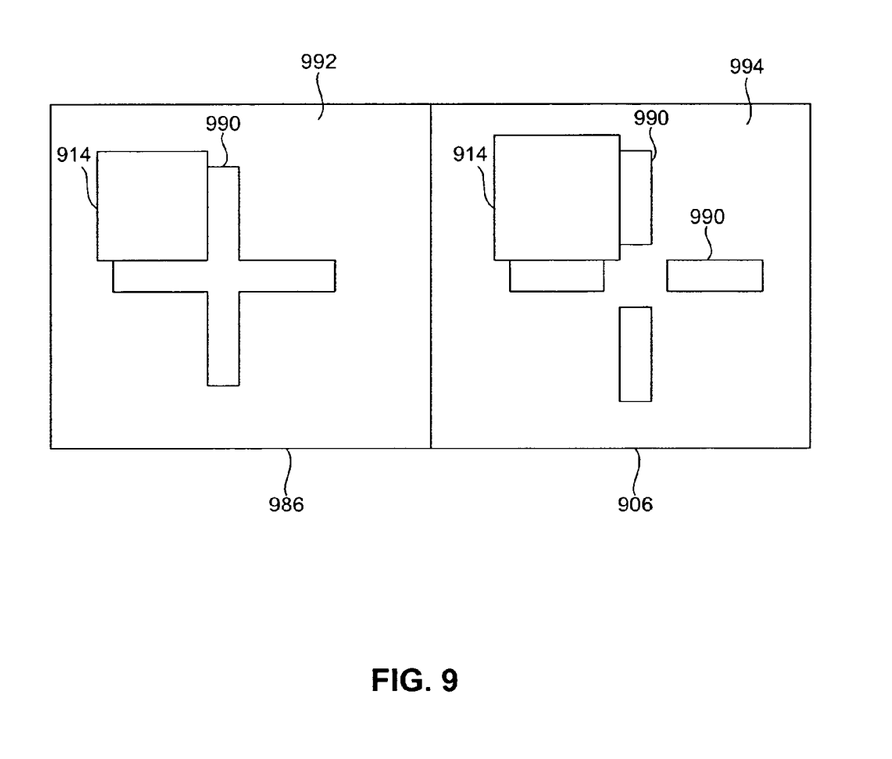
FIG. 9 shows a top view of a handler and a support table.

FIG. 9 shows a top view of a handler 986 and a support table 906, according to one embodiment of the present invention. In this embodiment, spacers 990 can be placed on a surface 992 of handler 886 and/or a surface 994 of support table 906 to make sure substrates 914 do not touch. Two exemplary arrangements of spaces are shown in FIG. 9, however, other arrangements and shapes of spacers are also contemplated within the scope of the present invention.

In yet another example, device 570 is loaded onto a handler and moved to and from a support table using a robot, while holding one or more substrates 514 simultaneously.

In any of the above embodiments and/or examples, a lithography device can be configured to carry one or more plates, panels, substrates, or workpieces simultaneously in order to increase throughput for current and future lithographic operations.

It is to be appreciated the exposure of multiple more plates, panels, substrates, or workpieces simultaneously can be performed using either maskless or mask-based lithography.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:
   an illumination system, wherein the illumination system is arranged to generate a beam of radiation;
   a patterning system, wherein the patterning system is arranged to pattern the beam;
   a substrate table, wherein the substrate table is arranged to simultaneously hold a plurality of substrates;
   a projection system, wherein the projection system is arranged to project the patterned beam onto a target portion of a corresponding one of the plurality of substrates;
   a substrate handler, wherein the substrate handler is arranged to move each of the plurality of substrates relative to the substrate table and is arranged to singly or simultaneously carry the plurality of substrates; and
   separation devices associated with the substrate table, wherein the separation devices are moveable to form various sized sections to at least one of hold or position various sized ones of the plurality of substrates.

2. The apparatus of claim 1, wherein the substrate handler carries at least two of the plurality of substrates simultaneously.

3. The apparatus of claim 1, wherein the substrate handler comprises:
   at least one support surface or platform, the at least one support surface or platform arranged to simultaneously carry the plurality of substrates to and from the substrate table.

4. The apparatus of claim 3, wherein the at least one support surface comprises:
   substrate transfer means that moves the substrate on or off the support surface.

5. The apparatus of claim 1, wherein the separation devices comprise:
   a frame positioned on the substrate table, the frame including two or more of the sections, wherein the two or more sections are arranged to at least one of hold or position at least two of the plurality of substrates.

6. The apparatus of claim 1, wherein the separation devices include one or more recesses, walls, or spacers.

7. The apparatus of claim 6, wherein the one or more recesses, walls, or spacers are movable to allow for resizing for the various sized ones of the plurality of substrates.

8. The apparatus of claim 6, wherein the one or more walls or spacers are retractable.

9. The apparatus of claim 1, further comprising:
   a robot, wherein the robot is arranged to position the plurality of substrates on the substrate handler and move the plurality of substrates from the substrate handler to the substrate table.

10. The apparatus of claim 1, wherein the separation devices comprise:
    a frame including the sections, wherein the sections are arranged to securely hold each of the plurality of substrates.

11. The apparatus of claim 10, wherein:
    the frame is positioned on the substrate handler; and
    a robot positions each of the plurality of substrates in the sections of the frame; and the substrate handler moves the frame onto the substrate table.

12. The apparatus of claim 10, wherein:

the frame is loaded with the plurality of substrates at a loading location and a robot moves the frame onto the substrate handler; and the substrate handler moves the frame onto the substrate table.

13. A method, comprising:

patterning a beam of radiation;

projecting the patterned beam onto a target portion of each of a plurality of substrates simultaneously supported on a same support table;

moving separation devices associated with the support table to form sections of various sizes corresponding to various sized ones of the plurality of substrates;

holding or positioning the plurality of substrates with the separation devices; and singly or simultaneously moving each of the plurality of substrates between a handling device and the support table.

14. The method of claim 13, further comprising using a frame having a plurality of the sections that is positioned on the substrate table as the separation devices, the frame securely holding the plurality of substrates.

15. The method of claim 14, wherein the frame is moved with the plurality of substrates between the handler and the support table.

16. The method of claim 14, wherein:

the frame is loaded with the plurality of substrates;

the frame is positioned on the handling device; and the frame is moved between the handling device and the substrate table.

17. The method of claim 14 further comprising:

integrating the frame having the plurality of sections into the support table to securely hold the plurality of substrates.

18. The method of claim 13, further comprising:

using a moving device to move the plurality of substrates onto the handler; and using the moving device to move the plurality of substrates between the handler and the support table.

19. The method of claim 13, further comprising:

using one of spacers, recesses, or spaces on the support table as the separation devices to separate the plurality of substrates.

20. The method of claim 19, further comprising:

allowing the one or more spacers or recesses to be one of moveable or retractable, such that the various sized ones of the plurality of substrates are simultaneously held.

* * * * *